United States Patent
Lu et al.

(10) Patent No.: US 11,133,269 B2
(45) Date of Patent: Sep. 28, 2021

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Chun-Ti Lu, Hsinchu (TW); Hao-Yi Tsai, Hsinchu (TW); Ming-Hung Tseng, Miaoli County (TW); Tsung-Hsien Chiang, Hsinchu (TW); Yen-Liang Lin, Taichung (TW); Tzu-Sung Huang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 21 days.

(21) Appl. No.: 16/655,247

(22) Filed: Oct. 17, 2019

(65) Prior Publication Data

US 2021/0118811 A1    Apr. 22, 2021

(51) Int. Cl.
| | |
|---|---|
| *H01L 23/00* | (2006.01) |
| *H01L 23/31* | (2006.01) |
| *H01L 23/538* | (2006.01) |
| *H01L 21/48* | (2006.01) |

(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC ............. H01L 21/565; H01L 21/76802; H01L 21/76885; H01L 21/76894; H01L 23/3128;
(Continued)

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |

(Continued)

FOREIGN PATENT DOCUMENTS

| | | |
|---|---|---|
| TW | 201633476 | 9/2016 |
| TW | 201824466 | 7/2018 |
| TW | 201941376 | 10/2019 |

OTHER PUBLICATIONS

"Office Action of Taiwan Counterpart Application", dated Oct. 21, 2020, p. 1-p. 8.

*Primary Examiner* — Jose R Diaz
(74) *Attorney, Agent, or Firm* — JCIPRNET (57) ABSTRACT

A semiconductor package and a manufacturing method for the semiconductor package are provided. The package comprises a die, through interlayer vias (TIVs), a dielectric film, a backside film and solder paste portions. The TIVs are disposed beside the semiconductor die and a molding compound laterally surrounds the die and the TIVs. The dielectric film is disposed on a backside of the semiconductor die, and the backside film is disposed on the dielectric film. The backside film has at least one of a coefficient of thermal expansion (CTE) and a Young's modulus larger than that of the dielectric film. The solder paste portions are disposed on the TIVs and located within openings penetrating through the dielectric film and the backside film. There is a recess located at an interface between the dielectric film and the backside film within the opening.

19 Claims, 9 Drawing Sheets

(51) Int. Cl.
  *H01L 21/56* (2006.01)
  *H01L 25/00* (2006.01)
  *H01L 25/10* (2006.01)
(52) U.S. Cl.
  CPC ........ *H01L 21/565* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 25/105* (2013.01); *H01L 25/50* (2013.01); *H01L 2224/214* (2013.01); *H01L 2225/1035* (2013.01); *H01L 2225/1058* (2013.01); *H01L 2924/3511* (2013.01)
(58) Field of Classification Search
  CPC .. H01L 23/315; H01L 23/562; H01L 21/6835
  See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2012/0280404 A1* | 11/2012 | Kwon .................. H01L 21/565 257/777 |
| 2015/0102502 A1* | 4/2015 | Chiu .................. H01L 23/3114 257/774 |
| 2019/0164907 A1 | 5/2019 | Chen et al. |

* cited by examiner

SEMICONDUCTOR PACKAGE AND MANUFACTURING METHOD THEREOF

BACKGROUND

Semiconductor wafers and semiconductor dies may be processed and packaged with other semiconductor devices or dies at the wafer level, and the control of the warpage is an important issue for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1G are schematic cross sectional views of various stages in a manufacturing method of a semiconductor package according to some exemplary embodiments of the present disclosure.

FIG. 3A to FIG. 3F are schematic cross sectional views of various stages in a manufacturing method of a semiconductor package according to some exemplary embodiments of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are schematic cross sectional views of various stages in a manufacturing method of a semiconductor package according to some exemplary embodiments of the present disclosure. In some embodiments, one or more dies are shown to represent plural dies of the wafer, and one or more packages are shown to represent plural semiconductor packages obtained following the semiconductor manufacturing method.

Figure 1A:
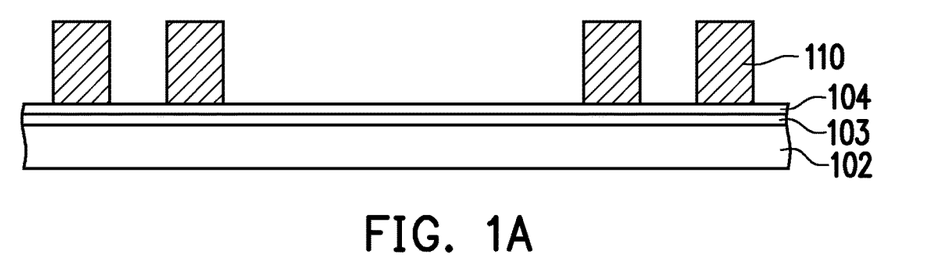

Referring to FIG. 1A, in some embodiments, a carrier 102 having a debond layer 103 and a dielectric layer 104 formed thereon is provided. For example, the debond layer 103 is disposed between the carrier 102 and the dielectric layer 104. In some embodiments, the carrier 102 is a glass substrate, the debond layer 103 includes a light-to-heat conversion (LTHC) release layer formed on the glass substrate. In some embodiments, the dielectric layer 104 includes a buffer layer and the material of the buffer layer includes polyimide (PI), polybenzoxazole (PBO), benzocyclobutene (BCB), or any other suitable polymer-based dielectric material.

Referring to FIG. 1A, in some embodiments, through interlayer vias (TIVs) 110 are formed on the dielectric layer 104 over the carrier 102. In some embodiments, the TIVs 110 are through integrated fan-out (InFO) vias. In some embodiments, the TIVs 110 may be formed by forming a mask pattern (not shown) on the dielectric layer 104 with openings exposing the dielectric layer 104 on the carrier 102, forming a metallic material filling the openings to form the TIVs by electroplating or deposition and then removing the mask pattern. In some embodiments, the TIVs 110 may be arranged beside and/or surround the location of the die. In alternative embodiments, the TIVs are optional and the formation of the TIVs may be omitted.

Figure 1B:
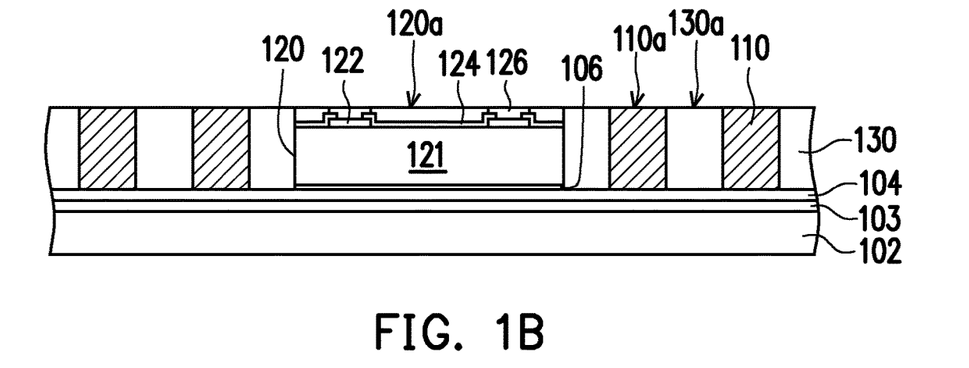

Referring to FIG. 1B, one or more dies 120 are provided and placed over the carrier 102. In FIG. 1B, only one die is shown as the exemplary die of the package structure, but it is understood that more than one die or different types of dies may be included within the package structure. In some embodiments, a die attach film 106 is provided between the dielectric layer 104 and the die 120 for better adhering the die 120 to the dielectric layer 104 of the carrier 102. In exemplary embodiments, as shown in FIG. 1B, the die 120 may include one or more types of chips selected from application-specific integrated circuit (ASIC) chips, analog chips, sensor chips, wireless and radio frequency chips, voltage regulator chips or memory chips. In certain embodiments, dies and chips may be used interchangeably.

In certain embodiments, in FIG. 1B, the die 120 is provided with contacts or pads 122 on the substrate 121 of the die 120, a passivation layer 124 formed over the substrate 121 with openings exposing the pads 122 and conductive posts 126 located within the openings and connected to the pads 122. In some embodiments, the pads 122 are aluminum pads, copper pads or other suitable metallic pads. In some embodiments, the material of the passivation layer 124 includes silicon nitride, silicon oxynitride, a polymer material or a dielectric material. In some embodiments, the conductive posts 124 are copper posts or copper alloy posts. In one embodiment, the die 120 is provided and attached to the carrier 102 with its active surface 120a facing upward. In certain embodiments, the TIVs 110 are arranged around the periphery of the die(s) 120. However, depending on product design, some of the TIVs 110 may be arranged at locations other than the periphery of the die 120. In certain embodiments, a plurality of dies 120 is stacked over the carrier 102 side-by-side, and the number of the dies arranged side-by-side or stacked over another die(s) may be adjusted or modified based on the product design but are not limited by the exemplary embodiments.

Referring to FIG. 1B, in some embodiments, the die(s) 120 and the TIVs 110 located over the carrier 102 are molded and encapsulated in a molding compound 130. In one embodiment, the molding compound 130 fills the space between the die 120 and the TIVs 110 and at least laterally covers the die 120 and the TIVs 110 over dielectric layer 104. In one embodiment, the material of the molding compound 130 includes epoxy resins, phenolic resins or silicon-containing resins. In some embodiments, the material of the molding compound 130 includes filler particles. In some embodiments, the molding compound 130 is over-molded and then planarized to expose tops 110a of the TIVs 110 and the active surfaces 120a of the die 120. In some embodiment, the over-molded molding compound 130 and the TIVs 110 are polished until the conductive posts 126 of the die 120 are exposed. In one embodiment, after the planarization, the tops 110a of the TIVs 110, the top surface 130a of the molding compound 130, and the active surface 120a of the die 120 become substantially levelled and flush with one another. In some embodiments, the molding compound 130 and/or the TIVs 110 are planarized through a grinding process or a chemical mechanical polishing (CMP) process.

Figure 1C:
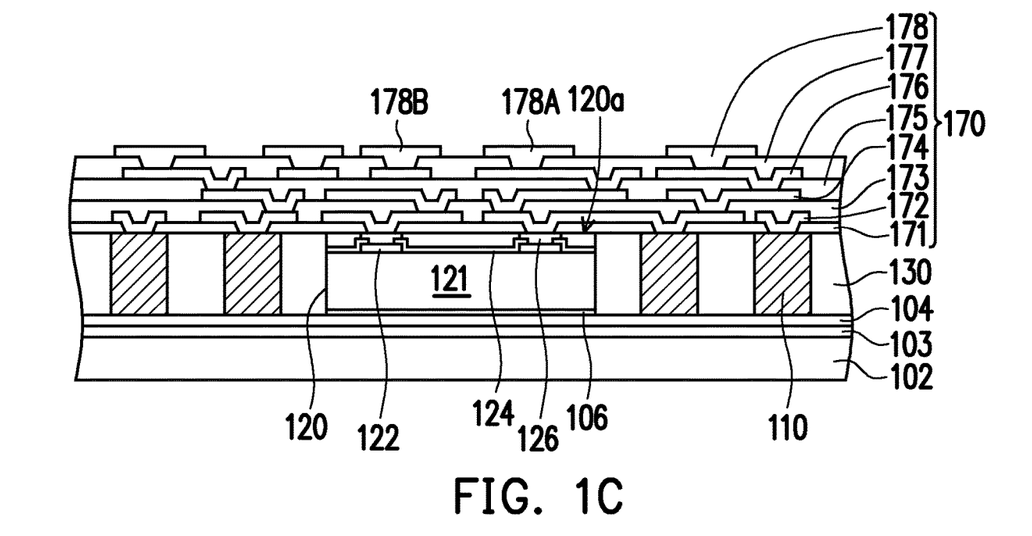

Referring to FIG. 1C, in some embodiments, a redistribution layer 170 is formed on the molded structure having the molding compound 130, the TIVs 110 and the die 120. In some embodiment, the redistribution layer 170 is electrically connected to the TIVs 110 and the die(s) 120. The formation of the redistribution layer 170 includes sequentially forming more than one dielectric material layers and more than one metallization layers in alternation.

Referring to FIG. 1C, in certain embodiments, the redistribution layer 170 is formed on the molding compound 130, over the TIVs 110 and on the die 120 by sequentially forming a first dielectric material layer 171, a first metallization layer 172, a second dielectric material layer 173, a second metallization layer 174, a third dielectric material layer 175 and a third metallization layer 176. In some embodiments, the formation of the redistribution layer 170 further includes forming the top dielectric material layer 177 with openings exposing portions of the third metallization layer 176, forming another metal layer (not shown) over the top dielectric material layer 177 filling the openings, and then patterning the metal layer to form the top metallization layer 178. In some embodiments, the first metallization layer 172 is electrically connected with the die 120 through the conductive posts 126 and is electrically connected with the TIVs 110.

In some embodiments, the materials of the dielectric material layers 171, 173, 175, 177 may be the same or different. In some embodiments, the materials of the dielectric material layers 171, 173, 175, 177 include one or more polymer dielectric materials such as polyimide, benzocyclobutene (BCB), polybenzooxazole (PBO), or any other suitable polymer-based dielectric materials. In some embodiments, the materials of the metallization layers 172, 174, 176, 178 may be the same or different, and the materials of the metallization layers 172, 174, 176, 178 may be selected from copper, nickel, aluminum, tungsten or combinations thereof. In some embodiments, the metallization layers 172, 174, 176 may include routing traces or fan-out traces. In some embodiments, the metallization layer 178 may include contact pads 178A and joining portions 178B for receiving bumps or other components. In some embodiments, the joining portions or contact pads may further optionally include an adhesion layer, a seed layer and/or under-ball metallurgy (UBM) patterns formed on the surfaces of the joining portions or pads for enhancing adhesion.

Figure 1D:
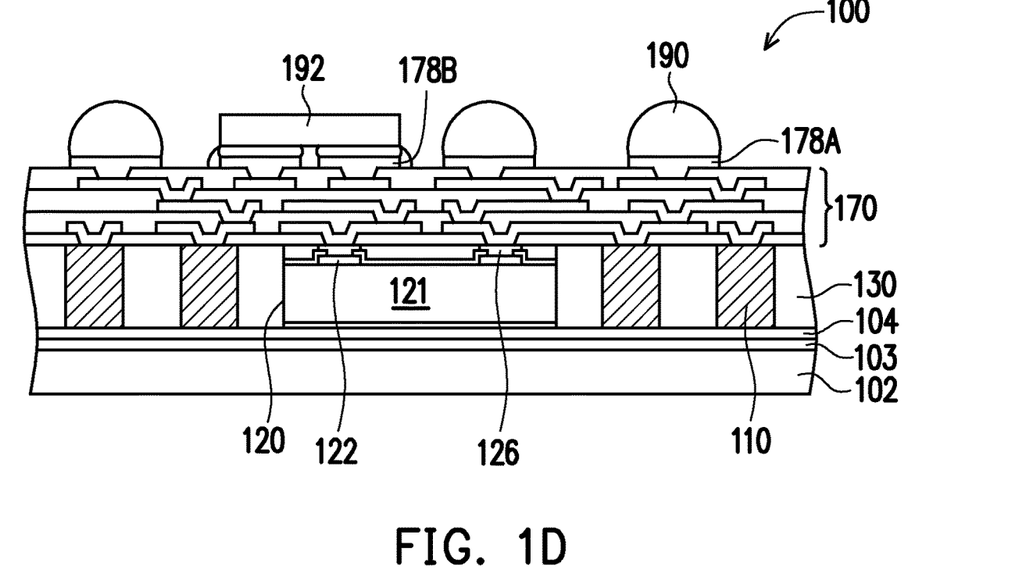

Referring to FIG. 1D, conductive elements 190 are disposed on the contact pads 178A of the redistribution layer 170. In some embodiments, the conductive elements 190 may be disposed on and fixed to the contact pads 178A by performing a ball placement process and then through a reflow process. In some embodiments, the conductive elements 190 are, for example, C4 bumps or micro-bumps. As shown in the FIG. 1D, some of the conductive elements 190 are electrically connected to the die 120 through the redistribution layer 170, and some of the conductive elements 190 are electrically connected to the TIVs 110 through the redistribution layer 170. In some embodiments, passive components 192, such as capacitors, inductors or resistors, are connected to the joining portions 178B of the redistribution layer 170 through a solder flux. In some embodiments, the passive components 192 may include integrated passive devices (IPDs).

Figure 1E:
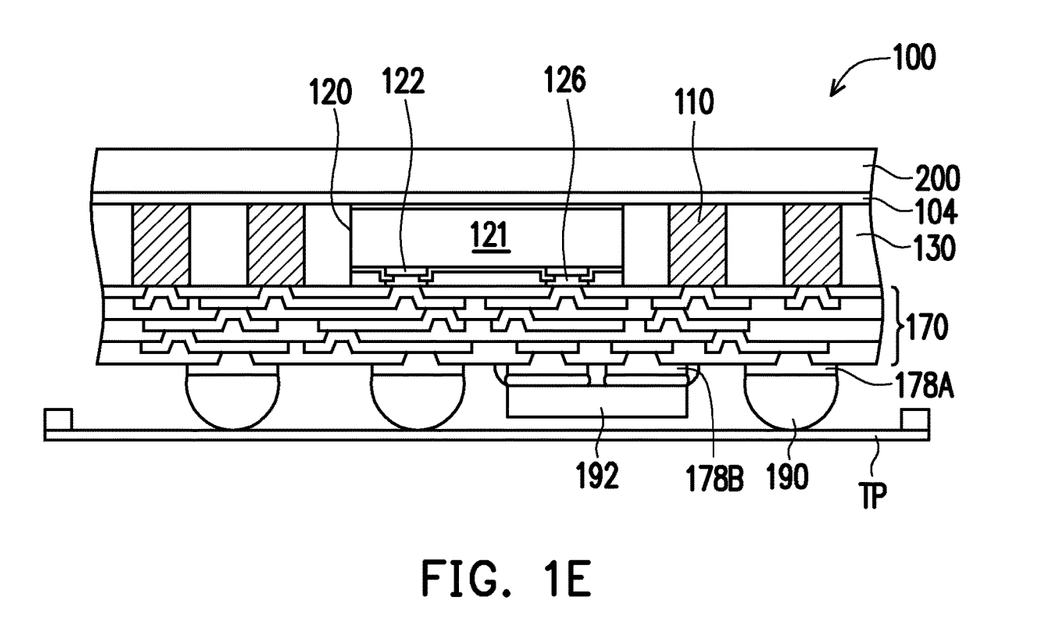

Referring to FIGS. 1D and 1E, in some embodiments, the package structure 100 is turned upside down (flipped) and transferred to a carrying tape TP, and the carrier 102 along with the debond layer 103 are then removed. Later, in FIG. 1E, a backside film 200 is formed on the dielectric layer 104 and over the molding compound 130 and the die(s) 120. In some embodiments, the backside film 200 is laminated on the dielectric layer 104 and then curing is performed to cure the backside film 200. In some embodiments, the backside film 200 is formed by coating or printing. In one embodiment, the backside film 200 has a thickness ranging from 20 microns to 100 microns. In some embodiments, the material of the backside film 200 may be a polymeric material including a resin material mixed fillers or a resin material with glass fibers. For example, the resin material includes epoxy resins, phenolic resins or silicon-containing resins. In certain embodiments, the polymeric material of the backside film 200 may include epoxy resins and fillers of small sizes, and the small-sized fillers may be silica fillers or alumina fillers having sizes smaller than 0.5 microns. The material of the backside film 200 may be chosen to make the backside film 200 turn transparent (transparent toward visible lights). By doing so, better alignment for the subsequently performed drilling process may be achieved and better overlay of the later formed pre-solder on the TIVs may be obtained.

The backside film 200 has a relatively high coefficient of thermal expansion (CTE) and/or a relatively high Young's modulus, so that the backside film 200 can alleviate or lessen the warpage of the package structure through the manufacturing processes, especially during the thermal processes.

In some embodiments, the backside film 200 has a coefficient of thermal expansion (CTE) larger than that of the underlying material layer(s). In certain embodiments, the backside film 200 has a CTE ranging from 10~200 ppm/° C., while the underlying dielectric layer 104 has a CTE ranging from 5~100 ppm/° C. In some embodiments, the backside film 200 has a Young's modulus higher than that of the underlying material layer(s). In certain embodiments, the backside film 200 has a Young's modulus larger than 5 GPa, while the underlying dielectric layer 104 has a Young's modulus smaller than 10 GPa. In some embodiments, the backside film 200 has a CTE larger than and a Young's modulus higher than those of the underlying material layer(s). In certain embodiments, the backside film 200 has a CTE ranging from 10~200 ppm/° C. and a Young's modulus larger than 5 GPa, while the underlying dielectric layer 104 has a CTE ranging from 5~100 ppm/° C. and a Young's modulus smaller than 10 GPa.

Figure 1F:
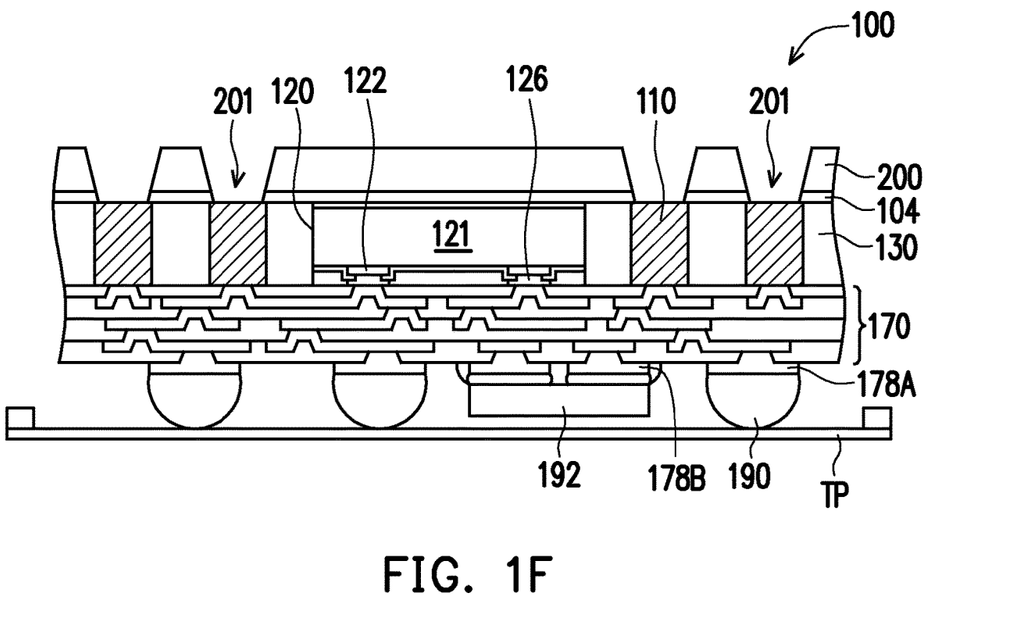
FIGS. 1F' & 1G' are schematic enlarged cross sectional views of the opening of the semiconductor package according to some exemplary embodiments of the present disclosure.

In FIG. 1F, the backside film 200 is partially removed by performing a laser process to formed openings 201. For example, the laser process includes a laser drilling process. In some embodiments, the laser process removes portions of the backside film 200 and removes portions of the underlying dielectric layer 104 to form the openings 201 exposing the underlying TIVs 110. In certain embodiments, as the backside film 200 is transparent, the alignment of the locations of the openings 201 toward the underlying TIVs 110 may be easier and more accurate. In principle, the locations of the openings 201 are vertically (in thickness direction) aligned and overlapped with the locations of the TIVs 110. In some embodiments, after performing the laser process, the formed openings 201 have sloped profiles.

In addition, if the backside film 200 is transparent, when the markings labelled on the back of the die(s) 120 can be clearly seen from above the backside film 200, the laser marking or laser ablation process may be skipped and the risk of damaging the die shall be avoided.

FIG. 1F' is a schematic enlarged cross sectional view of the opening 201 of the semiconductor package in FIG. 1F. In one embodiment, as shown in FIG. 1F', as the opening(s) 201 is formed by performing the laser process (e.g. the laser drilling process), the backside film 200 has slanted sidewall(s) 200S in the opening(s) 201, and the dielectric layer 104 also has slanted sidewall(s) 104S in the opening(s) 201. In some embodiments, from the cross sectional view, the slanted sidewall(s) 104S and the slanted sidewall(s) 200S are formed with different steepness. In one embodiment, the steepness of the slanted sidewall(s) 104S is smaller than the steepness of the slanted sidewall(s) 200S. In some embodiments, due to the differences in thermal properties (and/or mechanical properties) between the dielectric layer 104 and the backside film 200, there is a recess formed at an interface between the dielectric layer 104 and the backside film 200 after the laser process. In one embodiment, there is a recess RS formed between the slanted sidewall(s) 104S and the slanted sidewall(s) 200S. From the top view, if the opening 201 is formed as a round or oval shaped opening, the recess RS is formed as a ring-shaped or arc-shaped recess (air void). In some embodiments, when the opening 201 is formed with a size d1 (i.e. the largest dimension of the opening) of about 200~300 microns, the recess RS is formed with a recessed depth d2 (measuring from the most retreated portion to the most extended portion of the dielectric layer 104 in the opening) of about 0.5~5 microns.

Figure 1G:
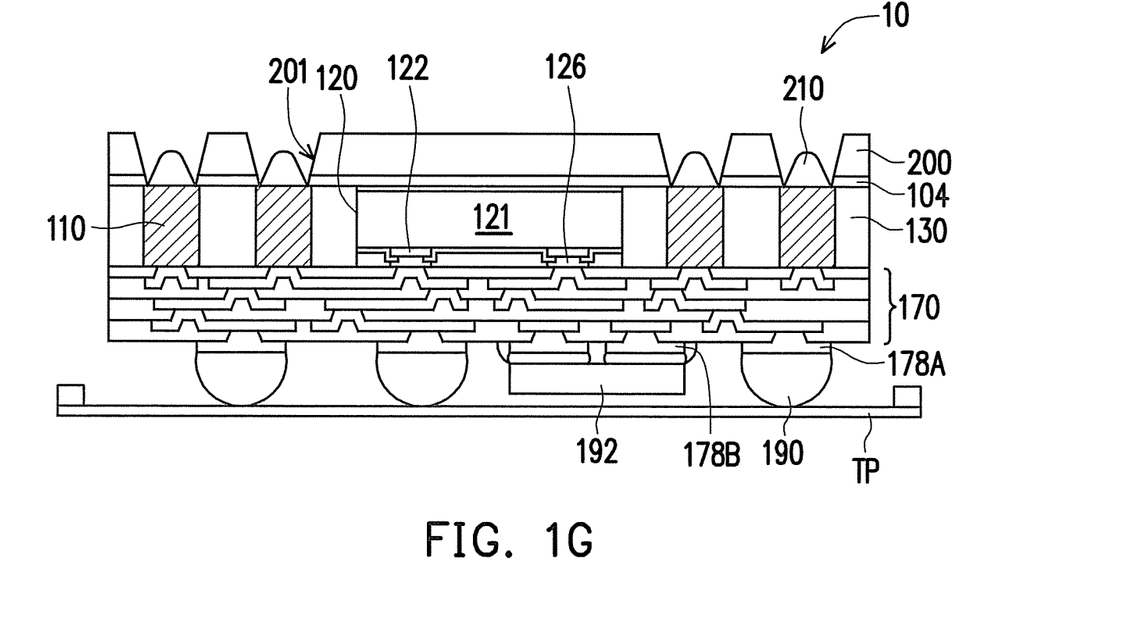

In FIG. 1G, in some embodiments, solder paste portions 210 are filled into the openings 201 and disposed directly on the TIVs 110 that are exposed by the openings 201 by applying a solder paste. In some embodiments, the openings 201 are not fully filled by the solder paste portions 210, so that the topmost of the solder paste portion(s) filled in the opening(s) 201 is lower than the top surface of the backside film 200. For example, the material of the solder paste may include a mixture of pre-alloyed solder powders and a flux. In certain embodiments, the solder paste may be formed by printing, coating or dispensing.

FIG. 1G' is a schematic enlarged cross sectional view of the opening 201 of the semiconductor package in FIG. 1G. In one embodiment, as shown in FIG. 1G', the solder paste portion 210 does not fill up the opening(s) 201 and does not fill up the recess RS in the opening(s) 201. For example, the amount of the solder paste portion 210 provided into the opening 201 is well controlled so that the opening 201 is not fully filled or just half-filled. In some embodiments, the solder paste portion 210 filled into the openings 201 does not contact the slanted sidewall(s) 200S of the backside film 200 and may partially contact the slanted sidewall(s) 104S of the dielectric layer 104 in the opening(s) 201, due to the viscosity of the solder paste. That is, the recess RS is not filled up by the solder paste portion 210 provided into the opening 201 and the recess RS is remained. In some embodiments, the solder paste portion 210 filled into the opening(s) 201 is in direct contact with the top surface of the TIV(s) 110. As shown in FIG. 1G', there is an empty space or gap G between the solder paste portion 210, the dielectric layer 104 and the backside film 200 inside the opening(s) 201.

Referring back to FIG. 1G, in some embodiments, a dicing process is later performed to cut the whole package structure 100 (at least cutting though the backside film 200, the dielectric layer 104, the molding compound 130 and the redistribution layer 170) into individual and separated semiconductor packages 10. In one embodiment, the dicing process is a wafer dicing process including mechanical sawing or laser cutting. In certain embodiments, marking process may be optionally performed to generate markings on the backside film 200 over the die 120.

FIG. 3A to FIG. 3F are schematic cross sectional views of various stages in a manufacturing method of a semiconductor package according to some exemplary embodiments of the present disclosure.

Figure 3A:
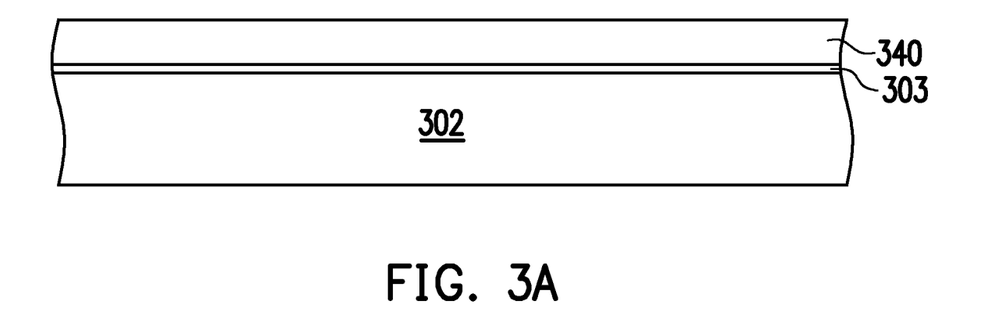

Referring FIG. 3A, in some embodiments, a carrier 302 having a debond layer 303 formed thereon is provided. In some embodiments, a backside film 340 is formed on the debond layer 303. In some embodiments, the carrier 302 is a glass substrate, the debond layer 303 includes a light-to-heat conversion (LTHC) release layer formed on the glass substrate. In some embodiments, the materials and formation of the backside film 340 are similar to the materials and formation of the backside film 200 as mentioned in the previous embodiment(s).

Figure 3B:
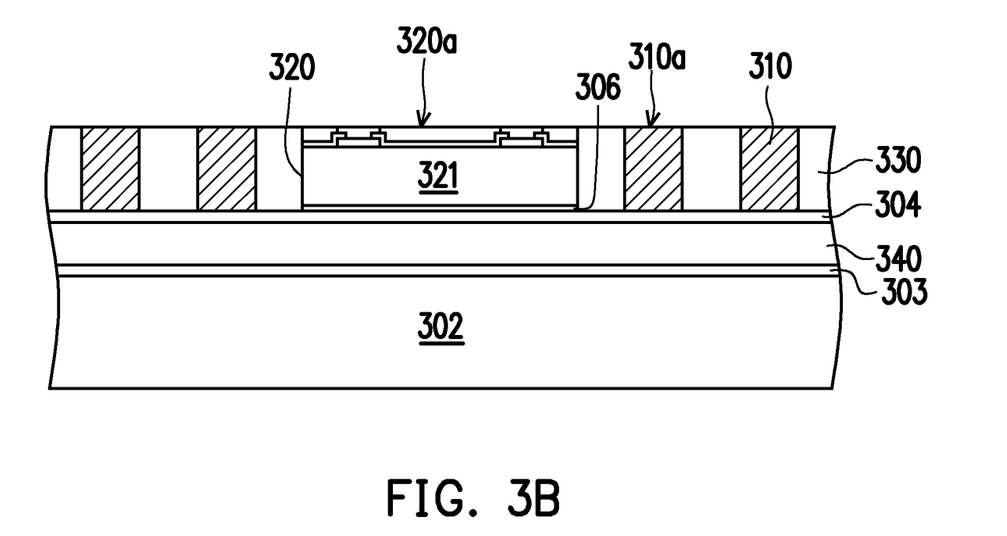

Referring to FIG. 3B, in some embodiments, a dielectric layer 304 is formed on the backside film 340 and through interlayer vias (TIVs) 310 are formed on the dielectric layer 304 over the carrier 302. In some embodiments, the TIVs 310 are through integrated fan-out (InFO) vias. As mentioned above, the materials and formation of the dielectric layer 304 and the TIVs 310 are similar to the materials and formation of the dielectric layer 104 and the TIVs 110. In alternative embodiments, the TIVs are optional and the formation of the TIVs may be omitted.

Referring to FIG. 3B, dies 320 (only one die is shown as the exemplary die) are provided and adhered to the dielectric layer 304 through the die attach film 306 provided between the die 320 and the dielectric layer 304. It is understood that more than one die or different types of dies may be included within the package structure. In addition, the die 320 may include one or more types of chips selected from application-specific integrated circuit (ASIC) chips, analog chips, sensor chips, wireless and radio frequency chips, voltage regulator chips or memory chips. In FIG. 3B, the die 320 is provided and adhered to the carrier 302 with its active surface 320a facing upward. Depending on product design, some of the TIVs 110 may be arranged around the periphery of the die(s) 320 or at locations other than the periphery of the die(s) 320.

Referring to FIG. 3B, in some embodiments, the die(s) 320 and the TIVs 310 are molded and encapsulated in a molding compound 330. In one embodiment, the molding compound 330 at least laterally surrounds the die 320 and the TIVs 310 and fills the space between the die 320 and the TIVs 310. In one embodiment, the material and formation of the molding compound 330 are similar to those of the molding compound 130. In some embodiments, after the planarization, the tops 310a of the TIVs 310 and the active surface 320a of the die 320 are exposed from the molding compound 330.

Figure 3C:
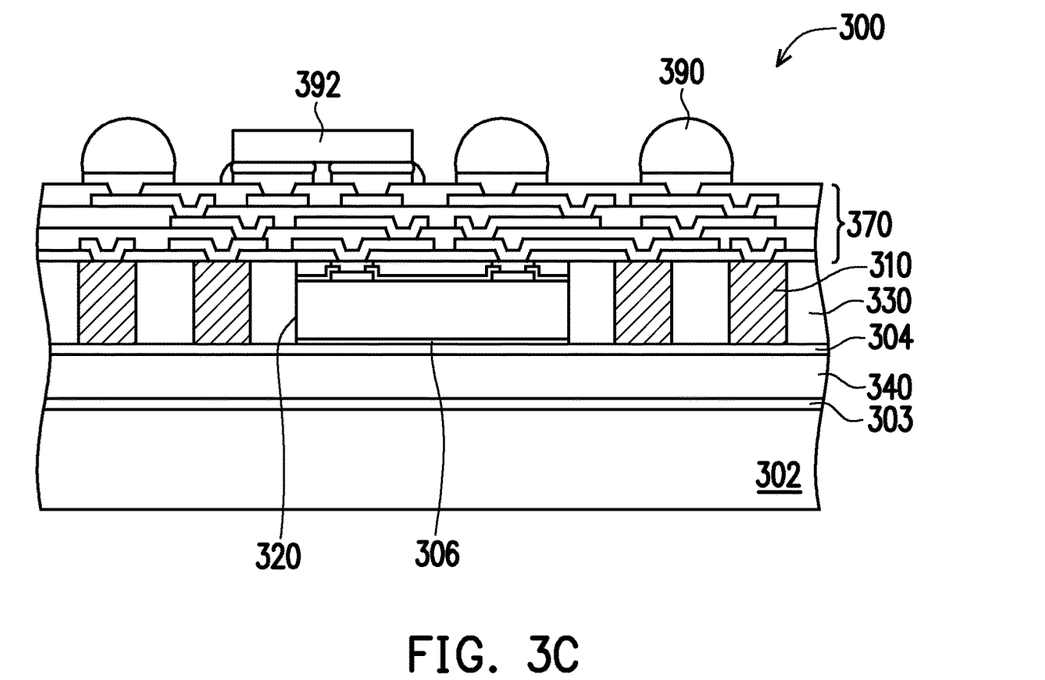

Referring to FIG. 3C, in some embodiments, a redistribution layer 370 is formed on the molding compound 330, over the TIVs 310 and on the die 320. In some embodiment, the redistribution layer 370 is electrically connected to the TIVs 310 and the die(s) 320. The formation of the redistribution layer 370 includes sequentially forming more than one dielectric material layers and more than one metallization layers in alternation, and the materials and formation of the redistribution layer 370 are similar to those of the redistribution layer 170.

Referring to FIG. 3C, conductive elements 390 and passive components 392 are disposed on and bonded to the redistribution layer 370. In some embodiments, the conductive elements 390 are, for example, C4 bumps or microbumps. As shown in the FIG. 3C, some of the conductive elements 390 are electrically connected to the die 320 through the redistribution layer 370, and some of the conductive elements 390 are electrically connected to the TIVs 310 through the redistribution layer 370.

Figure 3D:
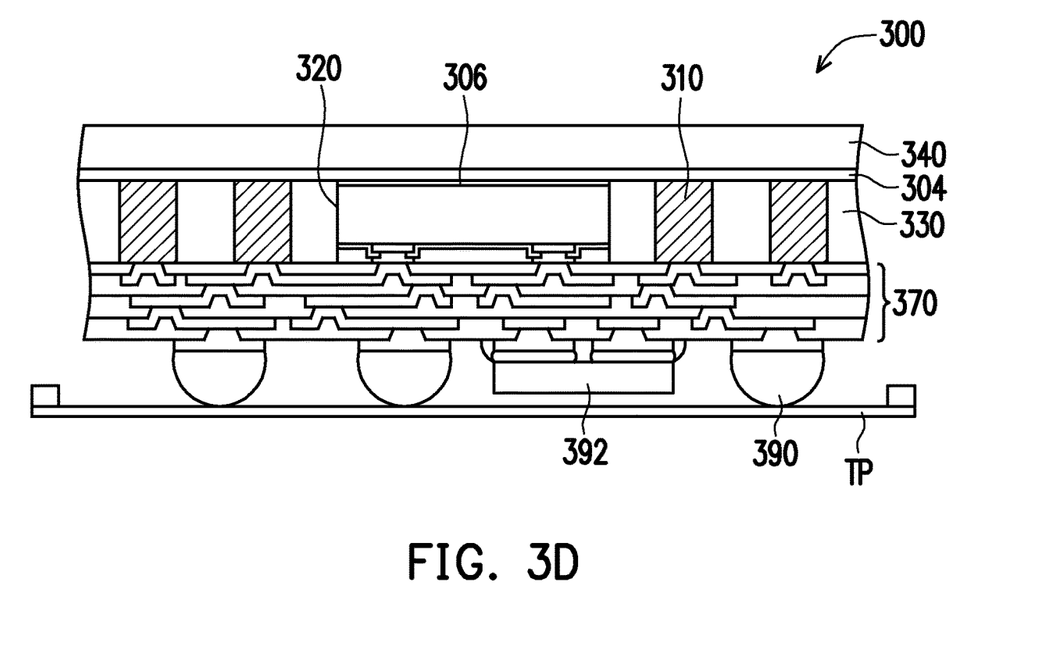

Referring to FIGS. 3C and 3D, in some embodiments, the package structure 300 is flipped and transferred to a carrying tape TP, and the carrier 302 along with the debond layer 303 are then removed. In FIG. 3D, the backside film 340 formed on the dielectric layer 304 is exposed. In some embodiments, the backside film 340 may be transparent (transparent toward visible lights).

Figure 3E:
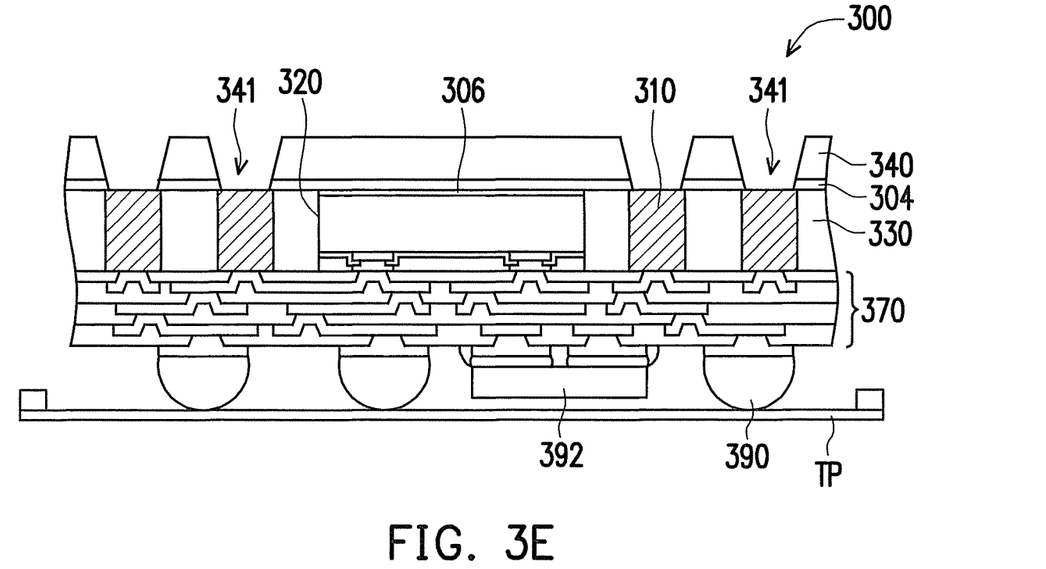

In FIG. 3E, openings 341 are formed in the backside film 340 by performing a laser process. In some embodiments, the laser process includes a laser drilling process. In some embodiments, the laser drilling process removes portions of the backside film 340 and removes portions of the underlying dielectric layer 304 to form the openings 341 exposing the underlying TIVs 310. During the laser drilling process, the backside film 340 and the dielectric layer 304 that are made of different materials are drilled through with different profiles to constitute the opening(s) 341. The profile of the opening 341 may be similar to the profile of the opening 201 shown in FIG. 1F', with the recess formed between the backside film 340 and the dielectric layer 304.

In certain embodiments, as the backside film 360 is transparent, the alignment of the openings 341 toward the underlying TIVs 310 is more accurate. In principle, the locations of the openings 341 are vertically (in thickness direction) aligned and overlapped with the locations of the TIVs 310. In some embodiments, after performing the laser process, the formed openings 341 have slanted sidewalls with sloped profiles.

Figure 3F:
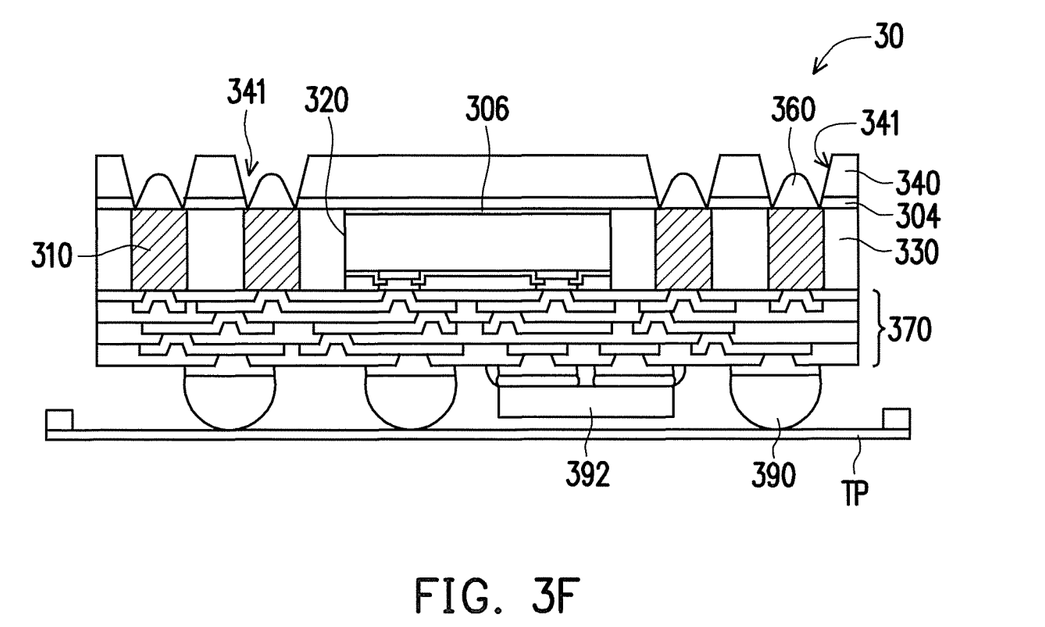

In FIG. 3F, in some embodiments, solder paste portions 360 are provided into the openings 341 and disposed directly on the TIVs 310 exposed by the openings 341. In some embodiments, the openings 341 are not fully filled by the solder paste portions 360. In embodiments, the amount of the solder paste portion 360 provided into the opening 341 is well controlled so that the solder paste portion 360 filled into the openings 341 does not contact the slanted sidewall(s) of the opening(s) 341, and the recess is remained. As described previously, there is an empty space or gap between the solder paste portion 360, the dielectric layer 304 and the backside film 340 inside the opening(s) 341.

Referring back to FIG. 3F, in some embodiments, a dicing process is later performed to cut the whole package structure 300 (at least cutting though the backside film 340, the dielectric layer 304, the molding compound 330 and the redistribution layer 370) into individual and separated semiconductor packages 30. In certain embodiments, marking process may be optionally performed to generate markings on the backside film 340 over the die 320.

In addition, as the backside film 340 is transparent, the markings labelled on the back of the die(s) 320 can be clearly seen from above the other side of the backside film 340, which may reduce or minimize the laser marking or laser ablation process and the risk that the die shall be damaged during the laser process may be avoided.

Since the backside film 340 has a relatively high coefficient of thermal expansion (CTE) and/or a relatively high Young's modulus, the backside film 340 can alleviate or lessen the warpage of the package structure through the manufacturing processes, especially during the thermal processes.

In some embodiments, the previously obtained semiconductor package(s) 10 or 30 may be employed as the final product. In alternative embodiments, the semiconductor package 10 or 30 may further include additional dies or sub-package units disposed over the die and another redistribution layer(s) may be formed to electrically connect the additional dies or sub-package units. The structures and/or the processes of the present disclosure are not limited by the exemplary embodiments.

Figure 2:
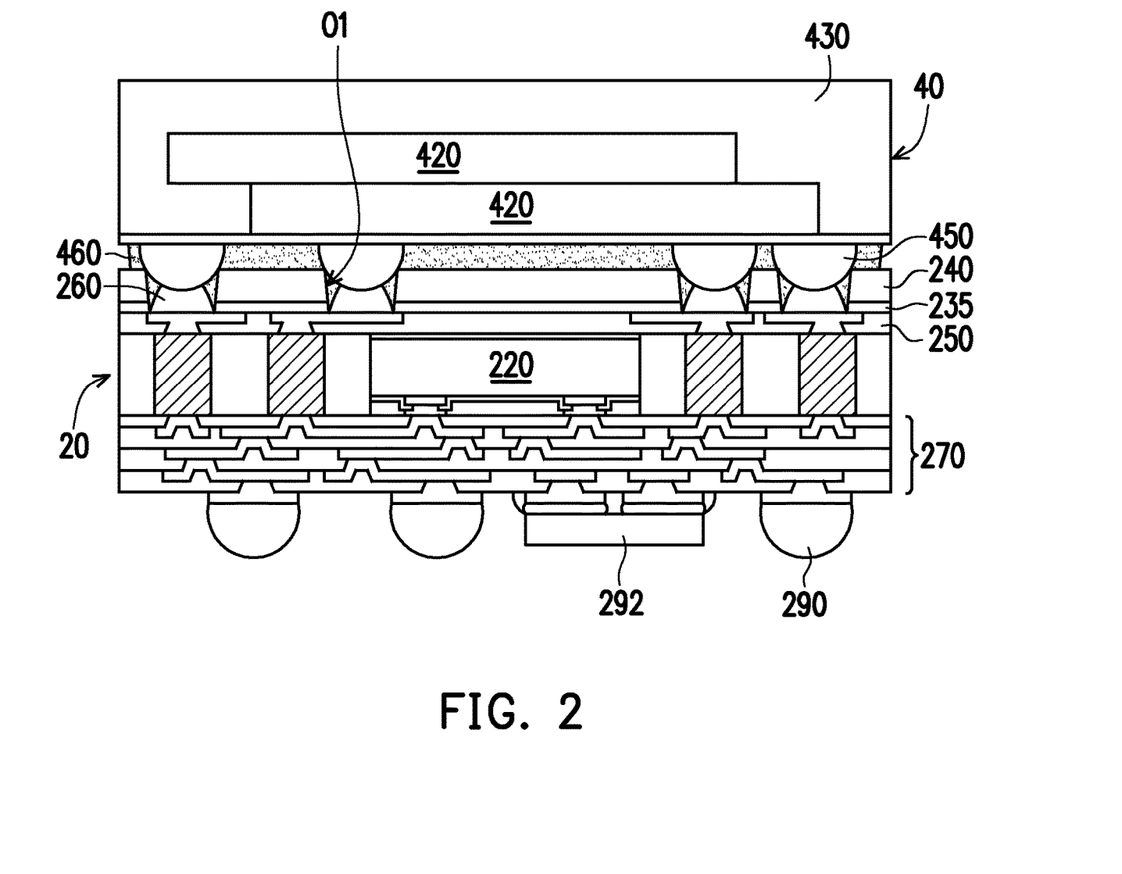
FIG. 2 is a schematic cross sectional view showing a semiconductor package according to some exemplary embodiments of the present disclosure.

FIG. 2 is a schematic cross sectional view showing a semiconductor package according to some exemplary embodiments of the present disclosure. In FIG. 2, the bottom package 20 is similar to package structure 10 or 30 formed following the processes described in FIG. 1A-FIG. 1G or FIG. 3A-FIG. 3F, except that an additional back redistribution layer (RDL) 250 is formed between the semiconductor die 220 and the stack of the dielectric layer 235 and the backside film 240. The bottom package 20 also includes a front side RDL 270 formed over the semiconductor die 220 and conductive elements 290 and components 292 mounted on the front side RDL 270. A top package 40 having stacked dies 420 encapsulated by the molding compound 430 and connectors 450 is connected with the bottom package 20 through the connectors 450 bonded with the solder paste portions 260 provided within the openings O1 of the stack of the dielectric layer 235 and the backside film 240. In some embodiments, the top package 40 may be pick and placed over the bottom package 20 and the connectors 450 are bonded with the solder paste portions 260 in the corresponding openings through a reflow process. Later, in some embodiments, an underfill 460 is formed between the top package 40 and the bottom package 20 and fills up the gaps between the top package 40 and the bottom package 20. In addition, the underfill 460 fills up the empty space or gap between the connectors 450, the solder paste portion 260, and the sidewalls of the openings O1. It is understood that the semiconductor package structure shown in FIG. 2 is merely an exemplary structure, and the formation of the backside RDL may be optional.

Figure 4:
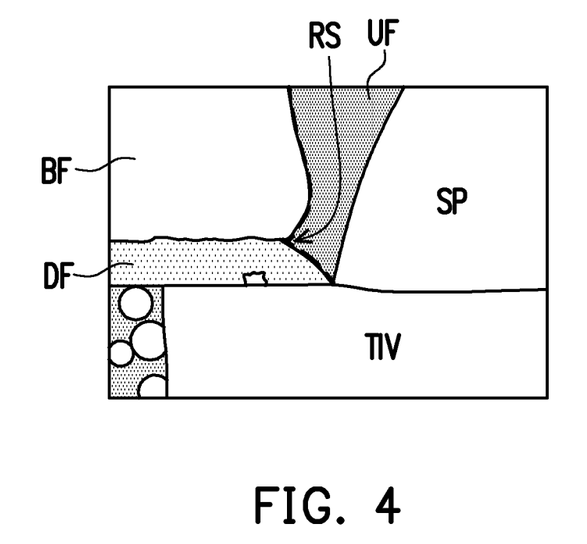
FIG. 4 is a schematic enlarged partial cross sectional view showing a connected portion of the semiconductor package structure according to some exemplary embodiments of the present disclosure.

FIG. 4 is a schematic enlarged partial cross sectional view showing a connected portion of the semiconductor package structure according to some exemplary embodiments of the present disclosure. In certain embodiments, as shown in FIG. 4, inside the opening defined by the dielectric film DF and the backside film BF, the underfill UF fills the recess RS located between the dielectric film DF and the backside film BF, and the underfill UF fills the empty space or gap between the solder paste portion SP, the dielectric film DF and the backside film BF. In some embodiments, the size of the opening is smaller than the size of the TIV, so that the TIV is not fully exposed. The solder paste portion SP that is formed on the exposed TIV is located directly on the TIV (denoted as TIV in FIG. 4) but the spreading span of the solder paste portion SP is limited by the dielectric film DF located on the TIV.

According to the above exemplary embodiments, the configuration of the stacked layers or package subunits may be suitably formed within the integrated fan-out (InFO) wafer-level package structure or a fan-in wafer-level package structure. The dielectric layer and the backside film laminated thereon may be formed of different materials and have different thermal and mechanical properties, such as different thermal conductivity, Young's modulus, and/or glass transition points. In some embodiments, as the backside film has at least one of a CTE and a Young's modulus higher than that or both of the underlying dielectric layer, the warpage of the package structure is significantly improved. Due to the differences in materials and its properties, the recess(es) is formed between the dielectric layer and the backside film after the laser drilling process.

According to some embodiments, the semiconductor package comprises a semiconductor die, through interlayer vias (TIVs), a stack of a dielectric film and a backside film and solder paste portions. The semiconductor die is laterally encapsulated by a molding compound. The TIVs are disposed beside the semiconductor die and the TIVs penetrate through the molding compound. The stack of the dielectric film and the backside film is disposed on a backside of the semiconductor die and disposed on the molding compound. The stack includes openings exposing the TIVs. The solder paste portions are disposed on the TIVs within the openings. There is a recess located at an interface between the dielectric film and the backside film within the opening.

According to some embodiments, the semiconductor package comprises a semiconductor die, through interlayer vias (TIVs), a dielectric film, a backside film and solder paste portions. The semiconductor die is laterally surrounded by a molding compound. The TIVs are disposed beside the semiconductor die and penetrate through the molding compound. The dielectric film is disposed on a backside of the semiconductor die and on the molding compound. The backside film is disposed on the dielectric film and over the backside of the semiconductor die and over the molding compound. The backside film has at least one of a coefficient of thermal expansion (CTE) and a Young's modulus larger than that of the dielectric film. The solder paste portions are disposed on the TIVs and located within openings of the dielectric film and the backside film. Recesses are located in sidewalls of the openings at an interface between the backside film and the dielectric film.

According to some embodiments, a manufacturing method for semiconductor packages is provided. A molded structure having dies and TIVs is provided. A redistribution layer is formed on a first side of the molded structure and on the die and the TIVs. The die and the TIVs are electrically connected to the redistribution layer. A dielectric layer is formed, and the dielectric layer is disposed on a second side of the molded structure, and the first and second sides are opposite sides of the molded structure. A backside film is formed. A laser process is performed to form openings in the backside film and the dielectric layer to expose the TIVs. Solder paste portions are provided into the openings and on the exposed TIVs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a semiconductor die, laterally encapsulated by a molding compound;
   through interlayer vias (TIVs), disposed beside the semiconductor die and penetrating through the molding compound;
   a stack of a dielectric film and a backside film, disposed on a backside of the semiconductor die and on the molding compound and having openings exposing the TIVs;
   a top package disposed on the stack and an underfill disposed between the top package and the stack; and
   solder paste portions, disposed on the TIVs within the openings,
   wherein there is a recess located at an interface between the dielectric film and the backside film within the opening and the underfill fills up the recess.

2. The semiconductor package as claimed in claim 1, further comprising a first redistribution layer disposed on an active surface of the semiconductor die.

3. The semiconductor package as claimed in claim 2, further comprising a second redistribution layer disposed on the backside of the semiconductor die.

4. The semiconductor package as claimed in claim 2, wherein the top package having one or more chips and connectors is disposed on the stack with the connectors bonded with the solder paste portions.

5. The semiconductor package as claimed in claim 4, further comprising a second redistribution layer disposed on the backside of the semiconductor die.

6. The semiconductor package as claimed in claim 4, wherein the underfill fills up spaces between the connectors.

7. The semiconductor package as claimed in claim 1, wherein the openings penetrating through the stack have slanted sidewalls.

8. The semiconductor package as claimed in claim 7, wherein the solder paste portion partially fills the opening without filling up the recess and without contacting the slanted sidewalls of the opening.

9. The semiconductor package as claimed in claim 1, wherein the dielectric film and the backside film are of different materials, and the dielectric film is located between the TIVs and the backside film.

10. A semiconductor package comprising:
a semiconductor die, laterally surrounded by a molding compound;
through interlayer vias (TIVs), disposed beside the semiconductor die and penetrating through the molding compound;
a dielectric film disposed on a backside of the semiconductor die and on the molding compound;
a backside film, disposed on the dielectric film and over the backside of the semiconductor die and over the molding compound, wherein the backside film has at least one of a coefficient of thermal expansion (CTE) and a Young's modulus larger than that of the dielectric film, and a material of the backside film includes filler particles and a size of the filler particles is smaller than 0.5 microns; and
solder paste portions, disposed on the TIVs and within openings penetrating through the dielectric film and the backside film, wherein recesses are located in sidewalls of the openings at an interface between the backside film and the dielectric film.

11. The semiconductor package as claimed in claim 10, wherein the material of the backside film includes a polymeric material.

12. The semiconductor package as claimed in claim 11, wherein the backside film is transparent toward invisible lights.

13. The semiconductor package as claimed in claim 10, further comprising a redistribution layer disposed on an active surface of the semiconductor die.

14. The semiconductor package as claimed in claim 13, further comprising:
a top package having one or more chips and connectors, wherein the top package is disposed on the backside film with the connectors bonded with the solder paste portions; and
an underfill, disposed between the top package and the backside film and between the solder paste portions, the dielectric film and the backside film.

15. The semiconductor package as claimed in claim 14, wherein the underfill fills up the recesses located at the interface between the dielectric film and the backside film within the openings.

16. A manufacturing method for semiconductor packages, comprising:
providing a molded structure having dies and TIVs;
forming a redistribution layer on a first side of the molded structure and on the die and the TIVs, wherein the die and the TIVs are electrically connected to the redistribution layer;
forming a dielectric layer, wherein the dielectric layer is disposed on a second side of the molded structure, and the first and second sides are opposite sides of the molded structure;
forming a backside film on the dielectric layer;
performing a laser process forming openings in the backside film and the dielectric layer to expose the TIVs and forming a recess at an interface between the backside film and the dielectric layer;
disposing solder paste portions into the openings and on the exposed TIVs;
disposing a top package with connectors and connecting the connectors with the solder baste portions; and
forming an underfill between the top package, the backside film and the dielectric layer and filling up the recess.

17. The method as claimed in claim 16, wherein performing a laser process comprises performing a laser drilling process drilling through the backside film and the dielectric layer until the TIV is exposed.

18. The method as claimed in claim 16, wherein the dielectric layer is formed before forming the redistribution layer, and the backside film is formed on the dielectric layer after forming the redistribution layer.

19. The method as claimed in claim 16, wherein the backside film is formed before forming the dielectric layer, and the dielectric layer is formed on the backside film before forming the redistribution layer.

* * * * *